United States Patent

Wang (10) Patent No.: US 8,643,443 B1
(45) Date of Patent: Feb. 4, 2014

(54) COMPARATOR AND RELAXATION OSCILLATOR EMPLOYING SAME

(75) Inventor: Zhengxiang Wang, Suzhou (CN)

(73) Assignee: Freescale Semiconductor, Inc, Austin, TX (US)

( * ) Notice: Subject to any disclaimer, the term of this patent is extended or adjusted under 35 U.S.C. 154(b) by 30 days.

(21) Appl. No.: 13/609,282

(22) Filed: Sep. 11, 2012

(30) Foreign Application Priority Data

Jul. 24, 2012 (CN) .......................... 2012 1 0257566

(51) Int. Cl.
| | | |
|---|---|---|
| H03K 3/0231 | (2006.01) | |
| H03K 3/354 | (2006.01) | |
| H03K 5/24 | (2006.01) | |
| H03K 4/502 | (2006.01) | |

(52) U.S. Cl.
CPC .......... *H03K 3/02315* (2013.01); *H03K 3/3545* (2013.01); *H03K 4/502* (2013.01); *H03K 5/2481* (2013.01); *H03K 5/249* (2013.01)
USPC ............... 331/111; 331/143; 327/66; 327/70; 327/77; 327/89; 327/182

(58) Field of Classification Search
CPC . H03K 3/023; H03K 3/0231; H03K 3/02315; H03K 3/353; H03K 3/354; H03K 3/3545; H03K 4/12; H03K 4/50; H03K 4/501; H03K 4/502; H03K 5/22; H03K 5/24; H03K 5/2472; H03K 5/2481; H03K 5/249
USPC ........... 327/63, 65–67, 69, 70, 72, 77, 87, 89, 327/182; 331/111, 143
See application file for complete search history.

(56) References Cited

U.S. PATENT DOCUMENTS

| | | | |
|---|---|---|---|
| 4,535,305 A | 8/1985 | Matsuo | |
| 4,623,852 A * | 11/1986 | Abou et al. | 331/111 |
| 5,287,068 A * | 2/1994 | Olmstead et al. | 330/9 |
| 5,369,319 A * | 11/1994 | Good et al. | 327/73 |
| 5,488,321 A * | 1/1996 | Johnson | 327/66 |
| 6,020,792 A | 2/2000 | Nolan | |
| 6,051,999 A * | 4/2000 | To et al. | 327/66 |
| 6,172,535 B1 * | 1/2001 | Hopkins | 327/66 |
| 6,320,429 B1 * | 11/2001 | Yano | 327/89 |
| 6,356,121 B1 * | 3/2002 | Garnier | 327/66 |
| 6,535,030 B1 * | 3/2003 | Nix | 327/65 |
| 7,109,804 B2 | 9/2006 | Mader | |
| 7,116,134 B2 * | 10/2006 | De Cremoux | 327/77 |
| 7,733,191 B2 | 6/2010 | Olmos | |
| 7,847,648 B2 | 12/2010 | Hu | |
| 8,054,141 B2 | 11/2011 | Saw | |
| 8,242,852 B2 * | 8/2012 | Denier | 331/111 |
| 8,471,749 B2 * | 6/2013 | Kabir et al. | 341/155 |
| 2010/0327914 A1 * | 12/2010 | Mohtashemi | 327/65 |
| 2011/0001572 A1 | 1/2011 | Shahparnia | |

* cited by examiner

*Primary Examiner* — Levi Gannon
(74) *Attorney, Agent, or Firm* — Charles Bergere (57) ABSTRACT

A relaxation oscillator has a comparator that includes first through third bias current transistors coupled to a first supply rail. First and second input transistors form a pair of parallel coupled transistors connected to the first bias current transistor. A first current mirror control transistor connects the first input transistor to a second supply rail. A first current mirror output transistor is coupled to the first current mirror control transistor, and connects the second bias current transistor to the second supply rail. A second current mirror control transistor connects the second input transistor to the second supply rail. A second current mirror output transistor is coupled to the second current mirror control transistor, and connects the third bias current transistor to the second supply rail. A transition time reduction transistor, coupled across the third bias current transistor, is coupled to the second bias current transistor, and provides a comparator output.

20 Claims, 5 Drawing Sheets

COMPARATOR AND RELAXATION OSCILLATOR EMPLOYING SAME

BACKGROUND OF THE INVENTION

The present invention relates to generation of clock signals for integrated circuits and, more particularly, to comparators and relaxation oscillators that use comparators.

Relaxation oscillator circuits are found in many electronic circuit applications and are often used for generating clock signals that control the timing of such electronic circuits. For example, relaxation oscillator circuits can be used DC/DC converters, counters, shifting modules, microcontrollers and modulation circuitry. Typically, the period of the clock signal provided by a relaxation oscillator circuit is determined primarily by charging and discharging of two capacitors. Such charging and discharging is often controlled by current sources or current mirrors supplying charge currents to the capacitors and the discharging is effected by controlling transistors coupled across the capacitors.

The charging and discharging of the capacitors typically provides ramp or saw-tooth waveform inputs to complementary comparators and the outputs of these comparators provides pulses that form an output waveform of the oscillator circuit. However, comparators have inherent low to high and high to low transition delays that can affect the upper limits and accuracy of the frequency of the oscillator circuit. Furthermore, such inherent transition delays are undesirable for comparator circuits that require a rapid response time.

Comparators are often designed to have rapid response times in order to reduce either or both of the low to high and high to low transition delays. However, such rapid response times are obtained at the expense of relatively large and undesirable quiescent currents that flow through either or both pull up and pull down transistors. It would therefore be beneficial to both relaxation oscillator circuits and comparators in general if the rapid response times are obtained without the use of relatively large quiescent currents.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that module, circuit, device components, method steps and structures that comprises a list of elements may include other elements not expressly listed or inherent to such module, circuit, steps or device components. Similarly, an element or step proceeded by "comprises" does not, without more constraints, preclude the existence of additional identical elements or steps that comprises the element or step. In this specification the terms gate, source and drain may be interchanged respectively with the terms base, emitter and collector. Furthermore, the terms coupled and connecting can refer to both direct and indirect connections between elements.

In one embodiment, the present invention provides a comparator comprising first, second and third bias current transistors each having a first node coupled to a first power supply rail and each of the transistors having a gate coupled to a regulating input. A first input transistor and a second input transistor form a pair of parallel coupled transistors having common nodes coupled to a second node of the first bias current transistor. The first input transistor has a gate providing a comparator first input port and the second input transistor has a gate providing a comparator second input port. A first current mirror control transistor couples the first input transistor to a second power supply rail and a first current mirror output transistor has a gate coupled to a gate of the first current mirror control transistor. The first current mirror output transistor couples a second node of the second bias current transistor to the second power supply rail.

A second current mirror control transistor couples the second input transistor to the second power supply rail and a second current mirror output transistor has a gate coupled to a gate of the second current mirror control transistor. The second current mirror output transistor couples a second node of the third bias current transistor to the second power supply rail. A transition time reduction transistor is coupled across the third bias current transistor such that a first node of the transition time reduction transistor is coupled to the first power supply rail and a second node of the transition time reduction transistor is coupled to the second node of the third bias current transistor. A gate of the transition time reduction transistor is coupled to the second node of the second bias current transistor, and the second node of the transition time reduction transistor provides an output port for the comparator.

In another embodiment the present invention provides a relaxation oscillator comprising a set discharge transistor coupled across a set capacitor and a reset discharge transistor coupled across a reset capacitor. A set reset latch has a set output coupled to a gate of the set discharge transistor and a reset output of the latch is coupled to a gate of the reset discharge transistor. A set comparator with a set comparator output port is coupled to a set input of the set reset latch, a set comparator first input port coupled to a reference voltage node, a set comparator second input port coupled to an electrode of the set capacitor. A reset comparator with a reset comparator output port is coupled to a reset input of the set reset latch, a reset comparator first input port coupled to a reference voltage node and a reset comparator second input port coupled to an electrode of the reset capacitor. The set comparator includes first, second and third bias current transistors each having a first node coupled to a first power supply rail and each of the transistors having a gate coupled to a regulating input.

A first input transistor and a second input transistor form a pair of parallel coupled transistors having common nodes coupled to a second node of the first bias current transistor. The first input transistor has a gate providing the set comparator first input port and the second input transistor has a gate providing the set comparator second input port. A first current mirror control transistor couples the first input transistor to a second power supply rail and a first current mirror output transistor has a gate coupled to a gate of the first current mirror control transistor. The first current mirror output transistor couples a second node of the second bias current transistor to the second power supply rail.

A second current mirror control transistor couples the second input transistor to the second power supply rail and a second current mirror output transistor has a gate coupled to a gate of the second current mirror control transistor. The second current mirror output transistor couples a second node of the third bias current transistor to the second power supply rail. A transition time reduction transistor is coupled across the third bias current transistor such that a first node of the transition time reduction transistor is coupled to the first power supply rail and a second node of the transition time reduction transistor is coupled to the second node of the third bias current transistor. A gate of the transition time reduction transistor is coupled to the second node of the second bias current transistor, and the second node of the transition time reduction transistor provides the set comparator output port.

In a further embodiment the present invention provides a relaxation oscillator comprising a transistor coupled across a capacitor. First, second and third bias current transistors are provided, each having a first node coupled to a first power supply rail and a gate coupled to a regulating input. A first input transistor and a second input transistor form a pair of parallel coupled transistors having common nodes coupled to a second node of the first bias current transistor. The first input transistor has a gate providing a comparator first input port coupled to a reference voltage node and the second input transistor has a gate providing a comparator second input port coupled to the capacitor. A first current mirror control transistor couples the first input transistor to a second power supply rail and a first current mirror output transistor has a gate coupled to a gate of the first current mirror control transistor. The first current mirror output transistor couples a second node of the second bias current transistor to the second power supply rail.

A second current mirror control transistor couples the second input transistor to the second power supply rail and a second current mirror output transistor has a gate coupled to a gate of the second current mirror control transistor. The second current mirror output transistor couples a second node of the third bias current transistor to the second power supply rail. A transition time reduction transistor is coupled across the third bias current transistor such that a first node of the transition time reduction transistor is coupled to the first power supply rail and a second node of the transition time reduction transistor is coupled to the second node of the third bias current transistor. A gate of the transition time reduction transistor is coupled to the second node of the second bias current transistor, and the second node of the transition time reduction transistor provides an output port for the comparator.

Figure 1:
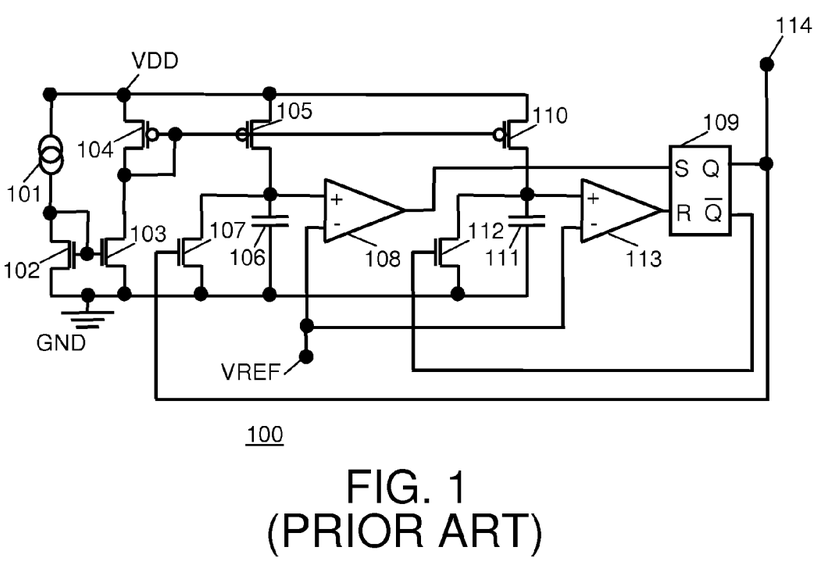
FIG. 1 is a circuit diagram of a circuit diagram of a conventional relaxation oscillator.

Referring to FIG. 1, a circuit diagram of a conventional relaxation oscillator 100 is shown. The relaxation oscillator 100 includes a constant current source 101 coupled between a supply voltage node VDD on one side and a drain and a gate electrode of a first bias transistor 102 on the other side. The gate electrode of the first bias transistor 102 is coupled to a gate electrode of a first mirror transistor 103 and the source electrodes of both transistors 102, 103 are coupled to a return voltage node (ground or GND).

A second bias transistor 104 with a source electrode coupled to the supply voltage node VDD and a gate electrode of the second bias transistor 104 is coupled to its own drain electrode, and to both a drain electrode of the first mirror transistor 103 and to a gate electrode of a second mirror transistor 105. A source electrode of the second mirror transistor 105 is coupled to the supply voltage node VDD and a drain electrode of the second mirror transistor 105 is coupled to a first electrode of a set capacitor 106. A second electrode of the set capacitor 106 is coupled to ground GND and the first electrode of the set capacitor 106 is further coupled to both a drain electrode of a set discharge transistor 107 and a positive input of a set comparator 108.

The relaxation oscillator 100 further includes a Set-Reset latch 109 with a set input S coupled to an output of the set comparator 108. There is also a third mirror transistor 110 that has a source electrode coupled to the supply voltage node VDD, a gate electrode coupled to the gate electrode of the second bias transistor 104, and a drain electrode that is coupled to a first electrode of a reset capacitor 111. A second electrode of the reset capacitor 111 is coupled to ground GND and the first electrode of the reset capacitor 111 is also coupled to both a drain electrode of a reset discharge transistor 112 and a positive input of a reset comparator 113. An output of the reset comparator 113 is coupled to a reset input R of the Set-Reset latch 109 and negative inputs of both comparators 108, 113 are coupled to a common threshold voltage reference node VREF.

An output QBAR of the Set-Reset latch 109 is coupled to a gate electrode of the reset discharge transistor 112 and output Q of the Set-Reset latch 109 is coupled to a gate electrode of the set discharge transistor 107. The set discharge transistor 107 and reset discharge transistor 112 have source electrodes coupled to ground GND and as shown an oscillator output node 114 is coupled to the output Q of the Set-Reset latch 109. However, if desired, the oscillator output node 114 can be coupled to output QBAR of the Set-Reset latch 109. As will be apparent to a person skilled in the art, an output signal SOUT is provided to the oscillator output node 114 and the frequency of this output signal SOUT is dependent on charging rates of the set and reset capacitors 106, 111. However, the accuracy and available maximum frequency of the output signal SOUT are dependent on the reaction times of the low to high and high to low transitions of the comparators 108, 113.

Figure 2:
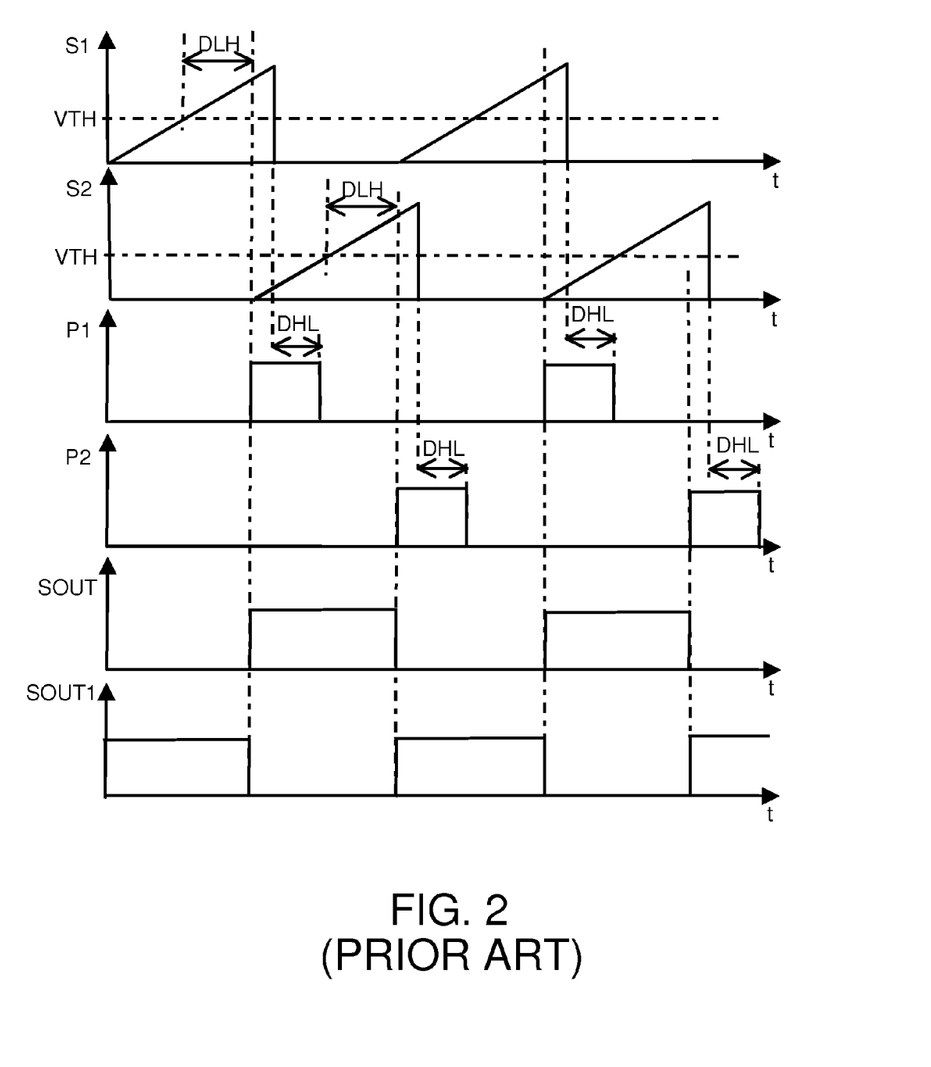
FIG. 2 is a waveform diagram illustrating waveforms generated by the relaxation oscillator of FIG. 1.

Referring to FIG. 2, a waveform diagram illustrating waveforms generated by the conventional relaxation oscillator 100 are shown. As illustrated, a substantially saw-tooth waveform S1 is generated at the positive input of the set comparator 108. This saw-tooth waveform S1 has a rising ramp portion caused by a charging of the set capacitor 106 and a falling portion caused by a discharging of the set capacitor 106. Ideally, once the saw-tooth waveform S1 reaches a potential equal to a threshold reference voltage VTH supplied from the reference node VREF, an output pulse P1 at the output of the set comparator 108 transitions from low to high. However, there is an inherent low to high transition delay DLH caused by the response times of the internal circuitry of the set comparator 108. As a result, the output pulse P1 does not immediately transition from low to high once the saw-tooth waveform S1 reaches a potential equal to a threshold reference voltage VTH. Also, the saw-tooth waveform S1 does not immediately fall to zero volts after the pulse P1 transition from low to high due to inherent delays in the Set-Reset latch 109 and a response time of the set discharge transistor 107.

When the saw-tooth waveform S1 falls below the threshold reference voltage VTH, there is an inherent high to low transition delay DHL caused by the response times of the internal circuitry of the set comparator 108. This high to low transition delay DHL increases the transitioning time of pulse P1 from high to low.

A substantially saw-tooth waveform S2 also is generated at the positive input of the reset comparator 113. This saw-tooth waveform S2 is caused by a charging and discharging of the reset capacitor 111. Ideally, once the saw-tooth waveform S2 reaches a potential equal to a threshold reference voltage VTH supplied from the reference node VREF, an output pulse P2 at the output of the reset comparator 113 transitions from low to high. However, again there is an inherent low to high transition delay DLH caused by the response times of the internal circuitry of the reset comparator 113. As a result, the output pulse P2 does not immediately transition from low to high once the saw-tooth waveform S2 reaches a potential equal to a threshold reference voltage VTH. Also, the saw-tooth waveform S2 does not immediately fall to zero volts after the pulse P2 transition from low to high due to inherent delays in the Set-Reset latch 109 and a response time of the reset discharge transistor 112.

In a similar fashion to the above, when the saw-tooth waveform S2 falls below the threshold reference voltage VTH, there is an inherent high to low transition delay DHL caused by the response times of the internal circuitry of the reset comparator 113. This high to low transition delay DHL increases the transitioning time of pulse P2 from high to low.

The pulses P1 and P2 control the outputs Q and QBAR of the Set-Reset latch 109, which results in respective output signals SOUT and SOUT1, wherein SOUT1 is anti-phase to SOUT. As will be apparent to a person skilled in the art, the accuracy of the frequency Fout of output signals SOUT and SOUT1 is dependent on the low to high transition delay DLH of each comparator 108, 113. Thus, if the low to high transition delay DLH of each comparator 108,113 varies then the accuracy of the frequency Fout of output signals SOUT and SOUT1 will also vary. It would therefore be beneficial to reduce the low to high transition delay DLH of each comparator 108,113 so that variations in this delay will be reduced. Similarly, the high to low transition delay DHL for each comparator 108,113 affects the available maximum frequency Fout of output signals SOUT and SOUT1 and therefore it would again be beneficial to reduce this delay.

Figure 3:
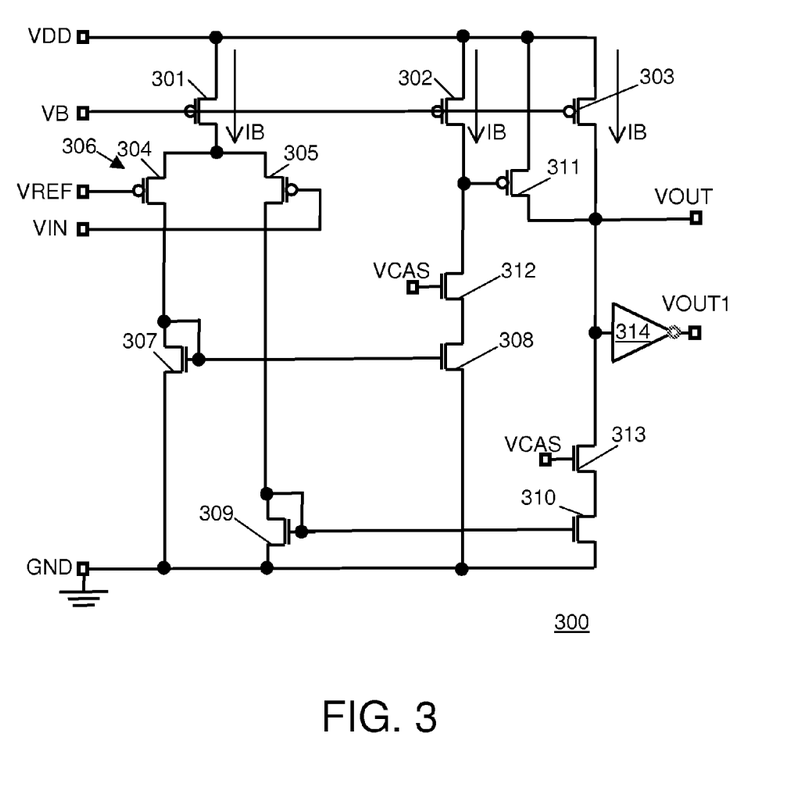
FIG. 3 is a circuit diagram of a comparator in accordance with a first preferred embodiment of the present invention

Referring to FIG. 3, a circuit diagram of a comparator 300 in accordance with a first preferred embodiment of the present invention is illustrated. The comparator 300 includes a first bias current transistor 301, second bias current transistor 302 and a third bias current transistor 303. Each of the bias current transistors 301, 302, 303 has a first node coupled to a first power supply rail VDD and each of the bias current transistors 301, 302, 303 has a gate coupled to a common regulating input VB. The first, second and third bias current transistors 301,302,303 are identical and therefore have the same conductivity properties across their channels. In operation they each provide a bias current IB that has identical maximum current flow limits in each of the first, second and third bias current transistors 301, 302, 303.

There is a first input transistor 304 and a second input transistor 305 forming a pair of parallel coupled transistors 306 having common nodes coupled to a second node of the first bias current transistor 301. The first input transistor 304 has a gate providing a comparator first input port VREF and the second input transistor 305 has a gate providing a comparator second input port VIN. The first input transistor 304 and second input transistor 305 are identical and when equal potentials are applied to the comparator first input port VREF and comparator second input port VIN, equal currents of IB/2 flow through both the first input transistor 304 and the second input transistor 305.

There is a first current mirror control transistor 307 coupling the first input transistor 304 to a second power supply rail GND. There is also a first current mirror output transistor 308 with a gate coupled to a gate of the first current mirror control transistor 307. The first current mirror output transistor 308 couples a second node of the second bias current transistor 302 to the second power supply rail GND and the first current mirror output transistor 308 is larger than the first current mirror control transistor 307. More specifically, the first current mirror output transistor 308 has a width to length ratio (W/L) of at least twice that of the width to length ration (W/L) of the first current mirror control transistor 307.

A second current mirror control transistor 309 couples the second input transistor 305 to the second power supply rail GND. There is also a second current mirror output transistor 310 with a gate coupled to a gate of the second current mirror control transistor 309. The second current mirror output transistor 310 couples a second node of the third bias current transistor 303 to the second power supply rail GND and the second current mirror output transistor 310 is larger than the second current mirror control transistor 309. Again, more specifically, the second current mirror output transistor 310 has a width to length ratio (W/L) of at least twice that of a width to length ratio (W/L) of the second current mirror control transistor 309.

The comparator 300 also includes a transition time reduction transistor 311 coupled across the third bias current transistor 303. A first node of the transition time reduction transistor 311 is coupled to the first power supply rail VDD and a second node of the transition time reduction transistor is coupled to the second node of the third bias current transistor 303. A gate of the transition time reduction transistor 311 is coupled to the second node of the second bias current transistor 302, and the second node of the transition time reduction transistor 311 provides an output port VOUT for the comparator 300. There is also another output port VOUT1 which is coupled to the output port VOUT through an inverter 314 and simply provides an inverted output of a signal or voltage level at output port VOUT.

There is a first isolating transistor 312 inserted between the first current mirror output transistor 308 and the second bias current transistor 302. There is also a second isolating transistor 313 inserted between the second current mirror output transistor 310 and the third bias current transistor 303. Gates of the both the first isolating transistor 312 and second isolating transistor 313 are coupled to a bias voltage which in this embodiment is a common isolating transistor bias voltage VCAS. As will be apparent to a person skilled in the art, the first isolating transistor 312 and second isolating transistor 313 reduce the capacitance loading effects of the first current mirror output transistor 308 and second current mirror output transistor 310 respectively. Hence, the inclusion of the first isolating transistor 312 and second isolating transistor 313 provides for a reduction in response time at the output port VOUT.

In this embodiment transistors 301, 302, 303, 304, 305 and 311 are P Channel Field Effect Transistors (FET) and transistors 307, 308, 309, 310, 312 and 313 are N Channel FETs. Also, in operation VDD would typically be set to approximately 3.3 volts, VB would be set to about 2.3 volts and VCAS would be set to about 1.1 Volts. Furthermore, VREF can be set to a low voltage of about 0.4 volts for high frequency and low power applications.

If a saw-tooth waveform S1 is supplied to the comparator second input port VIN, whilst the comparator first input port VREF is supplied with a constant threshold reference voltage VTH, then when the saw-tooth waveform S1 is at zero volts all of the bias current IB supplied through the first bias current transistor 301 will flow through the second input transistor 305. All of the bias current IB supplied through the first bias current transistor 301 will therefore flow through the second current mirror control transistor 309. In this state of operation, the transistors 304, 307 and 308 will be in a non-conducting (off) state and therefore the second bias current transistor 302 pulls the gate of the transition time reduction transistor 311 to approximately VDD. The transition time reduction transistor 311 is therefore in a non-conducting state and since the second current mirror output transistor 310 is in a conducting (ON) state the output port VOUT will be pulled towards GND (zero volts).

When the voltage of the saw-tooth waveform S1 is slightly greater than the threshold reference voltage VTH, most of the bias current IB supplied through the first bias current transistor 301 will flow through the first input transistor 304. This results in a greater proportion of the bias current IB flowing in the first current mirror control transistor 307 as compared that flowing in the second current mirror control transistor 309. Accordingly, the second current mirror output transistor 310 is essentially transitioning to a non-conducting state whereas the first current mirror output transistor 308 is in a conducting state which pulls the gate of the transition time reduction transistor 311 towards GND. When the gate voltage of the transition time reduction transistor 311 drops to VDD-VT (where VT is the transistor's conducting threshold voltage) transistor 311 begins conducting and therefore connects the output port VOUT to VDD.

Since the width to length ratio (W/L) of the transition time reduction transistor 311 is relatively large, it rapidly transitions the state of the output port VOUT from zero volts (GND) to VDD thereby reducing the inherent low to high transition delay DLH of the comparator 300. Similarly, when the voltage of the saw-tooth waveform S1 decays so that it is slightly less than the threshold reference voltage VTH, most of the bias current IB supplied through the first bias current transistor 301 will again flow through the second input transistor 305. As a result, the second current mirror output transistor 310 will rapidly pull the output port VOUT from VDD to zero volts (GND) thereby reducing the inherent high to low transition delay DHL of the comparator 300. It will be apparent to a person skilled in the art that the comparator first input port VREF and comparator second input port VIN can be interchanged so that the saw-tooth waveform S1 is applied to the inverting input instead of the non-inverting of the comparator 300. In this regard, depending on the operational requirements of comparator 300 application, either or both output ports VOUT or VOUT1 can be used as an output port of the comparator 300.

Figure 4:
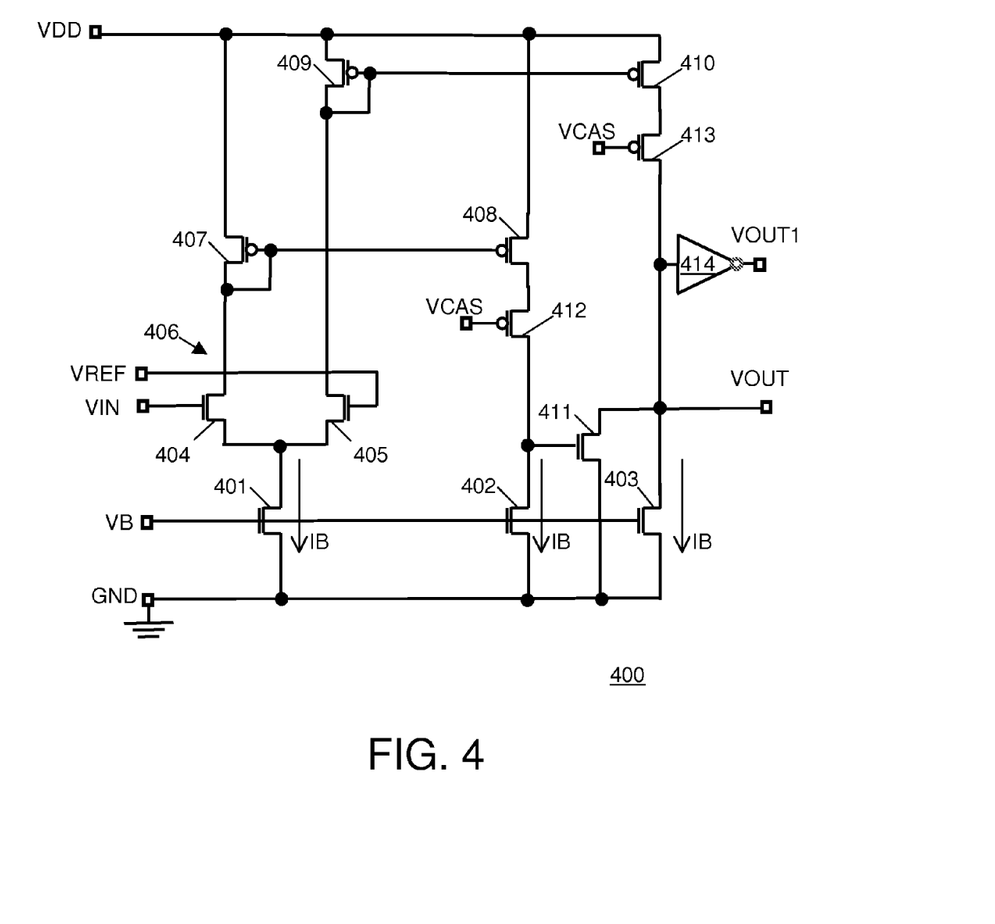
FIG. 4 is a circuit diagram of a comparator in accordance with a second preferred embodiment of the present invention.

Referring to FIG. 4, a circuit diagram of a comparator 400 in accordance with a second preferred embodiment of the present invention is shown. The comparator 400 includes a first bias current transistor 401, second bias current transistor 402 and a third bias current transistor 403. Each of the bias current transistors 401, 402, 403 has a first node coupled to a first power supply rail GND and each of the bias current transistors 401, 402, 403 has a gate coupled to a common regulating input VB. The first, second and third bias current transistors 401,402,403 are identical and therefore have the same conductivity properties across their channels. In operation they each provide a bias current IB that has identical maximum current flow limits in each of the first, second and third bias current transistors 401, 402, 403.

There is a first input transistor 404 and a second input transistor 405 forming a pair of parallel coupled transistors 406 having common nodes coupled to a second node of the first bias current transistor 401. The first input transistor 404 has a gate providing a comparator second input port VIN and the second input transistor 405 has a gate providing a comparator first input port VREF. The first input transistor 404 and second input transistor 405 are identical and when equal potentials are applied to the comparator first input port VREF and comparator second input port VIN, equal currents of IB/2 flow through both the first input transistor 404 and the second input transistor 405.

There is a first current mirror control transistor 407 coupling the first input transistor 404 to a second power supply rail VDD. There is also a first current mirror output transistor 408 with a gate coupled to a gate of the first current mirror control transistor 407. The first current mirror output transistor 408 couples a second node of the second bias current transistor 402 to the second power supply rail VDD and the first current mirror output transistor 408 is larger than the first current mirror control transistor 407. More specifically, the first current mirror output transistor 408 has a width to length ratio (W/L) of at least twice that of the width to length ration (W/L) of the first current mirror control transistor 407.

A second current mirror control transistor 409 couples the second input transistor 405 to the second power supply rail VDD. There is also a second current mirror output transistor 410 with a gate coupled to a gate of the second current mirror control transistor 409. The second current mirror output transistor 410 couples a second node of the third bias current transistor 403 to the second power supply rail VDD and the second current mirror output transistor 410 is larger than the second current mirror control transistor 409. Again, more specifically, the second current mirror output transistor 410 has a width to length ratio (W/L) of at least twice that of a width to length ratio (W/L) of the second current mirror control transistor 409.

The comparator 400 also includes a transition time reduction transistor 411 coupled across the third bias current transistor 403. A first node of the transition time reduction transistor 411 is coupled to the first power supply rail GND and a second node of the transition time reduction transistor is coupled to the second node of the third bias current transistor 403. A gate of the transition time reduction transistor 411 is coupled to the second node of the second bias current transistor 402, and the second node of the transition time reduction transistor 411 provides an output port VOUT for the comparator 400. There is also another output port VOUT1 which is coupled to the output port VOUT through an inverter 414 and simply provides an inverted output of a signal or voltage level at output port VOUT.

There there is a first isolating transistor 412 inserted between the first current mirror output transistor 408 and the second bias current transistor 402. There is also a second isolating transistor 413 inserted between the second current mirror output transistor 410 and the third bias current transistor 403. Gates of the both the first isolating transistor 412 and second isolating transistor 413 are coupled to a bias voltage which in this embodiment is a common isolating transistor bias voltage VCAS. The first isolating transistor 412 and second isolating transistor 413 reduce the capacitance loading effects of the first current mirror output transistor 408 and second current mirror output transistor 410 respectively.

Hence, as above, the inclusion of the first isolating transistor 412 and second isolating transistor 413 provides for a reduction in response time at the output port VOUT.

In this embodiment transistors 401, 402, 403, 404, 405 and 411 are N Channel FETs and transistors 407, 408, 409, 410, 412 and 413 are P Channel FETs. Also, in operation VDD would typically be set to approximately 3.3 volts, VB would be set to about 1 volt and VCAS would be set to about 2.2 Volts. It would therefore be apparent that in this embodiment VREF must be at least 1.2 volts and therefore it may not be able to operate at the same high frequency and low power applications as the comparator 300.

If a saw-tooth waveform S1 is supplied to the comparator second input port VIN, whilst the comparator first input port VREF is supplied with a constant threshold reference voltage VTH, then when the saw-tooth waveform S1 is at zero volts all of the bias current IB through the first bias current transistor 401 will flow through the second input transistor 405. All of the bias current IB flowing through the first bias current transistor 401 will therefore flow through the second current mirror control transistor 409. In this state of operation, the transistors 404, 407 and 408 will be in a non-conducting (off) state and therefore the second bias current transistor 402 pulls the gate of the transition time reduction transistor 411 to GND. The transition time reduction transistor 411 is therefore in a non-conducting state and since the second current mirror output transistor 410 is in a conducting (ON) state the output port VOUT will be pulled towards VDD.

When the voltage of the saw-tooth waveform S1 is slightly greater than the threshold reference voltage VTH, most of the bias current IB flowing through the first bias current transistor 401 will flow through the first input transistor 404. This results a greater proportion of the bias current IB flowing in the first current mirror control transistor 407 as compared that flowing in the second current mirror control transistor 409. Accordingly, the second current mirror output transistor 410 is essentially transitioning to a non-conducting state whereas the first current mirror output transistor 408 is in a conducting state which pulls the gate of the transition time reduction transistor 411 towards VDD. When the gate voltage of the transition time reduction transistor 411 rises to GND+VT (where VT is the transistor's conducting threshold voltage) transistor 411 begins conducting and therefore connects the output port VOUT to GND.

Since the width to length ratio (W/L) of the transition time reduction transistor 411 is relatively large, it rapidly transitions the state of the output port VOUT from VDD volts to GND thereby reducing the inherent high to low transition delay DHL of the comparator 400. Similarly, when the voltage of the saw-tooth waveform S1 decays so that it is slightly less than the threshold reference voltage VTH, most of the bias current IB flowing through the first bias current transistor 401 will again flow through the second input transistor 405. As a result, the second current mirror output transistor 410 will rapidly pull the output port VOUT from GND to VDD volts thereby reducing the inherent low to high transition delay DLH of the comparator 400. As above, it will be apparent to a person skilled in the art that the comparator first input port VREF and comparator second input port VIN can be interchanged so that the saw-tooth waveform S1 is applied to the non-inverting input instead of the inverting of the comparator 400. In this regard, depending on the operational requirements of comparator 300 application, either or both output ports VOUT or VOUT1 can be used as an output port of the comparator 400.

Figure 5:
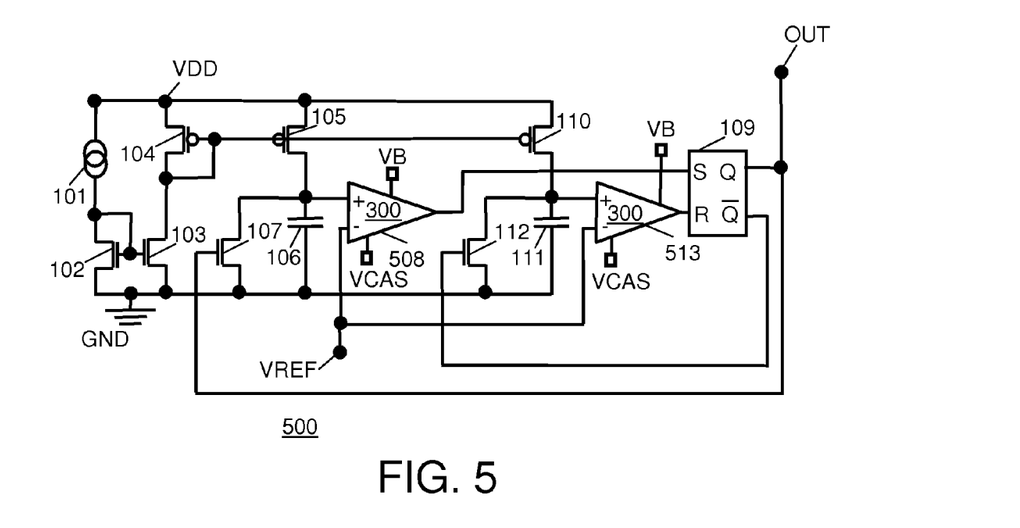
FIG. 5 is a circuit diagram of a relaxation oscillator in accordance with a third preferred embodiment of the present invention.

Referring to FIG. 5, a circuit diagram of a relaxation oscillator 500 in accordance with a third preferred embodiment of the present invention is shown. The relaxation oscillator 500 is an improved version of the prior art relaxation oscillator 300 and to avoid repetition only the differences will be described. The relaxation oscillator 500 has a set comparator 508 which is the comparator 300 with the common isolating transistor bias voltage VCAS and the common regulating input VB. As shown, the set comparator second input port (+) is coupled to an electrode of the set capacitor 106 and the discharge transistor 107 is coupled across the set capacitor 106.

The relaxation oscillator 500 also has a reset comparator 513 which is the comparator 300 with the common isolating transistor bias voltage VCAS and the common regulating input VB. The reset comparator second input port (+) is coupled to an electrode of the reset capacitor 111 and the reset discharge transistor 112 is coupled across the reset capacitor 111. Furthermore, the set comparator output port is coupled to the set input of the set reset latch 109 and the reset comparator output port is coupled to the reset input of the set reset latch 109. The oscillator output node OUT is coupled to the output Q of the Set-Reset latch 109 but, if required, it can be coupled to output QBAR of the Set-Reset latch 109.

Figure 6:
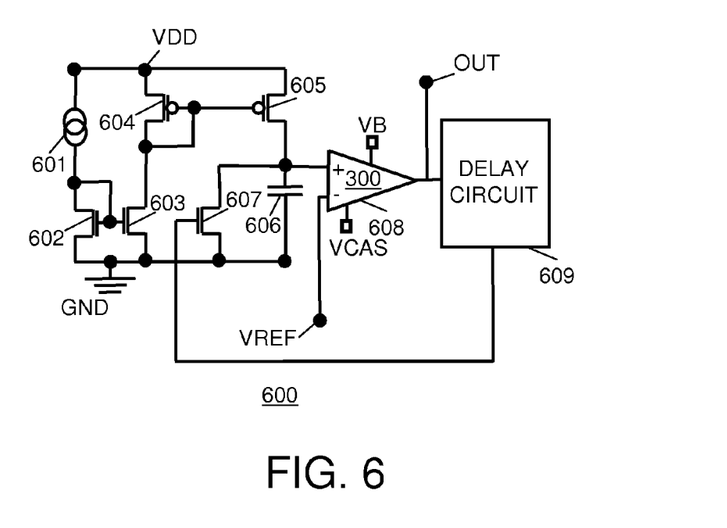
FIG. 6 is a circuit diagram of a relaxation oscillator in accordance with a fourth preferred embodiment of the present invention.

Referring to FIG. 6, a circuit diagram of a relaxation oscillator 600 in accordance with a fourth preferred embodiment of the present invention is illustrated. The relaxation oscillator 600 has constant current source 601 coupled between a supply voltage node VDD on one side and a drain and a gate electrode of a first bias transistor 602 on the other side. The gate electrode of the first reference transistor 602 is coupled to a gate electrode of a first mirror transistor 603 and the source electrodes of both transistors 602, 603 are coupled to a return voltage node (ground GND).

A second reference transistor 604 with a source electrode is coupled to the supply voltage node VDD and a gate electrode of the second reference transistor 604 is coupled to its own drain electrode, and to both a drain electrode of the first mirror transistor 603 and to a gate electrode of a second mirror transistor 605. A source electrode of the second mirror transistor 605 is coupled to the supply voltage node VDD and a drain electrode of the second mirror transistor 605 is coupled to a first electrode of a capacitor 606. A second electrode of the capacitor 606 is coupled to ground GND and the first electrode of the set capacitor 606 is further coupled to both a drain electrode of a discharge transistor 607 and a positive input of a comparator 608. Hence, the discharge transistor 607 coupled across a capacitor 606.

The comparator 608 is the comparator 300 with the common isolating transistor bias voltage VCAS and the common regulating input VB. The output of the comparator 608 is coupled to the gate of the discharge transistor 607 through a delay circuit 609. Furthermore, the oscillator output node OUT is coupled to the output of the comparator 608 and the output node OUT may be coupled through buffering circuitry if required.

As will be apparent to a person skilled in the art, although the oscillators 500 and 600 use the comparator 300, the comparator 400 can also be used. Furthermore, the inverting and non-inverting inputs of these comparators 300, 400 can be interchanged with minor adjustments to the oscillator circuitry. In this regard either or both output ports VOUT or VOUT1 can be used as an output port of the comparator 300 or 400.

Advantageously, the present invention provides for reducing or alleviating inherent low to high transition delays DLHs and/or high to low transition delays DHL in comparators. More specifically, then bias current IB can be relatively small and thus power consumption of the comparator 300, 400 is smaller than conventional rapid response comparators. The present invention is also especially beneficial for relaxation oscillators that use such relatively low power consumption comparators where either or both inherent low to high transition delays DLHs and/or high to low transition delays DHL are undesirable.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A comparator, comprising:
first, second and third bias current transistors each having a first node coupled to a first power supply rail and each having a gate coupled to a regulating input;
first and second input transistors forming a pair of parallel coupled transistors having common nodes coupled to a second node of the first bias current transistor, the first input transistor having a gate providing a comparator first input port and the second input transistor having a gate providing a comparator second input port;
a first current mirror control transistor coupling the first input transistor to a second power supply rail;
a first current mirror output transistor with a gate coupled to a gate of the first current mirror control transistor, wherein the first current mirror output transistor connects a second node of the second bias current transistor to the second power supply rail;
a second current mirror control transistor coupling the second input transistor to the second power supply rail;
a second current mirror output transistor with a gate coupled to a gate of the second current mirror control transistor, wherein the second current mirror output transistor connects a second node of the third bias current transistor to the second power supply rail; and
a transition time reduction transistor coupled across the third bias current transistor such that a first node of the transition time reduction transistor is coupled to the first power supply rail and a second node of the transition time reduction transistor is coupled to the second node of the third bias current transistor, wherein a gate of the transition time reduction transistor is coupled to the second node of the second bias current transistor, and wherein the second node of the transition time reduction transistor provides an output port for the comparator.

2. The comparator of claim 1, wherein the first, second and third bias current transistors are substantially identical and have the same conductivity properties across their channels.

3. The comparator of claim 2, wherein in operation the first, second and third bias current transistors have substantially the same maximum current flow limits.

4. The comparator of claim 1, wherein the first and second input transistors are substantially identical.

5. The comparator of claim 4, wherein in operation when equal potentials are applied to the first and second comparator input ports, equal currents flow through the first and second input transistors.

6. The comparator of claim 1, wherein the first current mirror output transistor is larger than the first current mirror control transistor.

7. The comparator of claim 1, wherein the first current mirror output transistor has a width to length ratio of at least twice that of the width to length ratio of the first current mirror control transistor.

8. The comparator of claim 1, wherein the second current mirror output transistor has a width to length ratio of at least twice that of a width to length ratio of the second current mirror control transistor.

9. The comparator of claim 1, further comprising a first isolating transistor connected between the first current mirror output transistor and the second bias current transistor.

10. The comparator of claim 9, further comprising a second isolating transistor connected between the second current mirror output transistor and the third bias current transistor.

11. A relaxation oscillator, comprising:
a set discharge transistor coupled across a set capacitor;
a reset discharge transistor coupled across a reset capacitor;
a set reset latch with a set output coupled to a gate of the set discharge transistor and a reset output coupled to a gate of the reset discharge transistor;
a set comparator with a set comparator output port coupled to a set input of the set reset latch, a set comparator first input port coupled to a reference voltage node, a set comparator second input port coupled to an electrode of the set capacitor; and
a reset comparator with a reset comparator output port coupled to a reset input of the set reset latch, a reset comparator first input port coupled to the reference voltage node and a reset comparator second input port coupled to an electrode of the reset capacitor,
wherein the set comparator includes:
first, second and third bias current transistors each having a first node coupled to a first power supply rail and each having a gate coupled to a regulating input;
first and second input transistors forming a pair of parallel coupled transistors having common nodes coupled to a second node of the first bias current transistor, the first input transistor having a gate providing the set comparator first input port and the second input transistor having a gate providing the set comparator second input port;
a first current mirror control transistor coupling the first input transistor to a second power supply rail;
a first current mirror output transistor with a gate coupled to a gate of the first current mirror control transistor, wherein the first current mirror output transistor couples a second node of the second bias current transistor to the second power supply rail;
a second current mirror control transistor coupling the second input transistor to the second power supply rail;
a second current mirror output transistor with a gate coupled to a gate of the second current mirror control transistor, wherein the second current mirror output transistor couples a second node of the third bias current transistor to the second power supply rail; and
a transition time reduction transistor coupled across the third bias current transistor such that a first node of the transition time reduction transistor is coupled to the first power supply rail and a second node of the transition time reduction transistor is coupled to the second node of the third bias current transistor, wherein a gate of the transition time reduction transistor is coupled to the second node of the second bias current transistor, and
wherein the second node of the transition time reduction transistor provides the set comparator output port.

12. The relaxation oscillator of claim 11, wherein the set comparator first input port and the reset comparator first input port are coupled to a common reference voltage node.

13. The relaxation oscillator of claim 11, wherein the first, second and third bias current transistors are identical.

14. The relaxation oscillator of claim 11, wherein when equal potentials are applied to the first and second set comparator input ports, equal currents flow through the first and second input transistors.

15. The relaxation oscillator of claim 11, wherein the reset comparator includes:
first, second and third bias current transistors each having a first node coupled to a first power supply rail and each having a gate coupled to a regulating input;
first and second input transistors forming a pair of parallel coupled transistors having common nodes coupled to a second node of the first bias current transistor, the first input transistor having a gate providing the reset comparator first input port and the second input transistor having a gate providing the reset comparator second input port;
a first current mirror control transistor coupling the first input transistor to a second power supply rail;
a first current mirror output transistor with a gate coupled to a gate of the first current mirror control transistor, wherein the first current mirror output transistor couples a second node of the second bias current transistor to the second power supply rail;
a second current mirror control transistor coupling the second input transistor to the second power supply rail;
a second current mirror output transistor with a gate coupled to a gate of the second current mirror control transistor, wherein the second current mirror output transistor couples a second node of the third bias current transistor to the second power supply rail; and
a transition time reduction transistor coupled across the third bias current transistor such that a first node of the transition time reduction transistor is coupled to the first power supply rail and a second node of the transition time reduction transistor is coupled to the second node of the third bias current transistor, wherein a gate of the transition time reduction transistor is coupled to the second node of the second bias current transistor, and wherein the second node of the transition time reduction transistor provides the reset comparator output port.

16. The relaxation oscillator of claim 15, wherein the first current mirror output transistor has a width to length ratio of at least twice that of the width to length ration of the first current mirror control transistor.

17. The relaxation oscillator of claim 16, wherein the second current mirror output transistor has a width to length ratio of at least twice that of a width to length ratio of the second current mirror control transistor.

18. A relaxation oscillator, comprising:
a transistor coupled across a capacitor;
first, second and third bias current transistors each having a first node coupled to a first power supply rail and a gate coupled to a regulating input;
first and second input transistors forming a pair of parallel coupled transistors having common nodes coupled to a second node of the first bias current transistor, the first input transistor having a gate providing a comparator first input port coupled to a reference voltage node and the second input transistor having a gate providing a comparator second input port coupled to the capacitor;
a first current mirror control transistor coupling the first input transistor to a second power supply rail;
a first current mirror output transistor with a gate coupled to a gate of the first current mirror control transistor, wherein the first current mirror output transistor couples a second node of the second bias current transistor to the second power supply rail;
a second current mirror control transistor coupling the second input transistor to the second power supply rail;
a second current mirror output transistor with a gate coupled to a gate of the second current mirror control transistor, wherein the second current mirror output transistor couples a second node of the third bias current transistor to the second power supply rail; and
a transition time reduction transistor coupled across the third bias current transistor such that a first node of the transition time reduction transistor is coupled to the first power supply rail and a second node of the transition time reduction transistor is coupled to the second node of the third bias current transistor, wherein a gate of the transition time reduction transistor is coupled to the second node of the second bias current transistor, and wherein the second node of the transition time reduction transistor provides an output port for the comparator.

19. The relaxation oscillator of claim 18, wherein the first current mirror output transistor has a width to length ratio of at least twice that of the width to length ration of the first current mirror control transistor.

20. The relaxation oscillator of claim 19, wherein the second current mirror output transistor has a width to length ratio of at least twice that of a width to length ratio of the second current mirror control transistor.

* * * * *